United States Patent
Zocher et al.

(10) Patent No.: US 8,223,900 B2
(45) Date of Patent: Jul. 17, 2012

(54) RECEIVER WITH MIXED-MODE AUTOMATIC GAIN CONTROL

(75) Inventors: Andrew Zocher, Monticello, IL (US); Luiz Antonio Razera, Jr., San Jose, CA (US); Arman Hematy, Portland, OR (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 680 days.

(21) Appl. No.: 12/396,425

(22) Filed: Mar. 2, 2009

(65) Prior Publication Data

US 2010/0220820 A1   Sep. 2, 2010

(51) Int. Cl.
*H04L 27/08* (2006.01)

(52) U.S. Cl. ........ 375/345; 375/230; 375/297; 375/311; 375/320

(58) Field of Classification Search .................. 375/345, 375/230, 297, 311, 320
See application file for complete search history.

(56) References Cited

U.S. PATENT DOCUMENTS

| | | | |
|---|---|---|---|
| 5,200,655 A | 4/1993 | Feldt | |
| 5,483,691 A | 1/1996 | Heck et al. | |
| 5,684,431 A | 11/1997 | Gilbert et al. | |
| 5,742,899 A | 4/1998 | Blackburn et al. | |
| 6,417,730 B1 | 7/2002 | Segallis et al. | |
| 6,654,594 B1 | 11/2003 | Hughes et al. | |
| 6,759,906 B2 * | 7/2004 | Matsunaga et al. | 330/285 |
| 6,847,261 B2 * | 1/2005 | Iwata et al. | 330/279 |
| 6,885,852 B2 | 4/2005 | Hughes et al. | |
| 7,391,260 B2 | 6/2008 | Kim et al. | |
| 7,403,071 B2 | 7/2008 | Hollenbeck et al. | |
| 2004/0178851 A1 * | 9/2004 | Ishida et al. | 330/279 |
| 2007/0229340 A1 | 10/2007 | Krishnamoorthi et al. | |

* cited by examiner

*Primary Examiner* — Kabir A Timory
(74) *Attorney, Agent, or Firm* — TIPS Group

(57) ABSTRACT

In an embodiment, set forth by way of example and not limitation, a receiver with automatic gain includes a receiver stage, an AGC stage, and a digital processor which collectively define an AGC loop. Preferably, the AGC stage has a control circuit and a feedback circuit with matched transfer characteristics. A digital processor is operative to develop a gain control signal to set a desired gain level of the receiver stage to an optimal level based upon a waveform analysis derived from the gain feedback signal.

14 Claims, 6 Drawing Sheets

RECEIVER WITH MIXED-MODE AUTOMATIC GAIN CONTROL

CROSS REFERENCE TO RELATED APPLICATIONS

This application is related to U.S. Ser. No. 12/396,421 filed concurrently herewith and U.S. Ser. No. 12/396,422 filed concurrently herewith, both of which are incorporated herein by reference.

BACKGROUND

Automatic gain control (AGC) is an adaptive system found in many electronic devices. Typically, the average output signal level is fed back to adjust the gain to an appropriate level for a range of input signal levels. AGC has been long-applied in receiver technologies.

For example, without AGC the sound emitted from an amplitude modulated (AM) receiver would vary to an extreme extent from a weak to a strong signal. The AGC effectively reduces the volume if the signal is strong and raises it when it is weaker. AGC technologies can also be applied, for example, to frequency modulated (FM) receivers and phase modulated (PM) receivers.

Digital receivers are designed to amplify and detect digitally encoded signals. Such receivers may also be paired with digital transmitters to form digital transceivers. In some instances, the digital receivers can be multi-mode, such as digital AM receivers and digital FM receivers. Various AGC systems have been designed for such digital receivers.

Since AGCs operate by feeding back some of the output of a stage to control the gain, they are often referred to as having "AGC loops." AGCs are of three general types: 1) all-digital; 2) analog; and 3) mixed-mode including both digital and analog components.

U.S. Patent Publication 20070229340 of Krishnamoorthi et al. describes an all-digital gain control system. However, a fully digital implementation such as that described by Krishnamoorthi et al. requires a very wide dynamic range front end, including the ADC. Such a system would likely have substantial power requirements due to the requirement of the very wide dynamic range.

U.S. Pat. No. 5,483,691 of Heck et al. describes an analog AGC loop with dual control ports. However, analog loops are slow to settle since the gain control feedback delay must be much greater than the signal path delay to ensure stability. An analog loop can be substantially slower than a mixed-mode loop, depending on the initial conditions of the stability capacitor and the strength of the input signal.

U.S. Pat. No. 5,742,899 of Blackburn et al. describes another analog loop with optimized initial conditions on the feedback capacitor to improve attack time. However, a large feedback capacitor is required to stabilize the AGC loop and thus the charging and discharging of the feedback capacitor would slow the AGC settling time.

U.S. Pat. No. 6,417,730 of Seagallis et al. describes a mixed-mode control loop where the controller manipulates the gain of a plurality of variable-gain stages to get within the linear range of a sensor. This patent describes a system which "hunts" for a desired operating level for the AGC by incrementally adjusting gain. This results in a variable settling time for the AGC loop. Furthermore, this system has an attenuator which is not linear in dB, making it difficult to account for the attenuator setting when calculating RSSI (Received Signal Strength Indication, a measure of the power present in a received radio signal).

U.S. Pat. Nos. 6,654,594 and 6,885,582 of Hughes et al. describe mixed-mode AGC loops with various features. For example, attenuator step-size during acquisition can be varied to help improve attack time and an out-of-band detector can be added to account for overload conditions. However in both of these embodiments, the controller again hunts for the optimum gain control setting as it steps through various attenuation settings and then measures the results, slowing the settling rate of the AGC loop.

U.S. Pat. No. 5,684,431 of Gilbert et al. describes a Bipolar Junction Transistor ("BJT") implementation with "active feedback" and U.S. Pat. No. 5,200,625 of Feldt describes another BJT implementation. U.S. Pat. No. 7,403,071 by Hollenbeck et al. describes an RF CMOS variable gain amplifier and U.S. Pat. No. 7,391,260 of Kim et al. describes another all-CMOS circuit. The control characteristic for these four references is linear-in-dB with respect to a continuous control voltage. However, to implement a mixed-mode control system with these circuits would require a voltage DAC, which consumes power and may degrade settling time. Also, CMOS solutions typically have only approximately 25 dB of linear control dynamic range.

It will be appreciated that while there are a variety of AGC circuits in the prior art, that all suffer from one or more limitations. What is needed is a low cost, low power, fast-attack AGC solution that avoids incremental automatic gain control whenever possible.

These and other limitations of the prior art will become apparent to those of skill in the art upon a reading of the following descriptions and a study of the several figures of the drawing.

SUMMARY

In an embodiment, set forth by way of example and not limitation, a receiver with automatic gain includes a receiver stage, a matched AGC stage, and a digital processor. In this example embodiment, the receiver stage is provide with a modulated signal input, a signal output, an AGC input and an AGC output, where a signal at the signal output experiences a gain from the receiver stage. In this example embodiment, the matched AGC stage has a control circuit and a feedback circuit. The control circuit has an AGC DAC with a digital input and an analog output and also has an LNA gain controller with an input coupled to the analog output of the AGC DAC and an output coupled to the AGC input of the receiver stage. The feedback circuit includes a peak detector with an input coupled to the AGC output and an output, and also a RSSI ADC with an input coupled to the output of the peak detector and a digital output defining a waveform.

In this example embodiment, the control circuit and the feedback circuit have matched transfer characteristics. Also in this example embodiment, the digital processor has a waveform input coupled to the digital output of the RSSI ADC and an control output coupled to the digital input of the AGC DAC. This example digital processor is operative to develop a gain control signal at the control output to set a desired gain level of the receiver stage to an optimal level based upon a waveform analysis derived from the gain feedback signal. An example advantage of this arrangement is that the incremental AGC control of the receiver stage (as is common in the prior art) may be avoided.

In an alternate embodiment, set forth by way of example and not limitation, a receiver stage includes a variable gain preamplifier circuit with, as inputs, a modulated signal input and an AGC input. This example embodiment also includes an intermediate frequency circuit with an input coupled to an output of the preamplifier circuit. A detector circuit, in this non-limiting example, has an input coupled to an output of the intermediate frequency circuit. Also, in this non-limiting example, a rectification circuit has an input coupled to an output of the detector circuit.

In an embodiment, set forth by way of example and not limitation, a method for automatic gain control of a receiver includes: a) developing a digital waveform from an output of a receiver; b) analyzing the digital waveform in a processor; and c) applying a gain control signal to the receiver which was developed as a result of the analyzing the digital waveform in the processor to set a desired gain level of the receiver to an optimal level, whereby incremental AGC control of the receiver stage may be avoided.

In an embodiment, set forth by way of example and not limitation, an automatic gain control system includes: a) means for developing a digital waveform from an output of a receiver; b) means for analyzing the digital waveform in a processor; and c) means for applying a gain control signal to the receiver which was developed as a result of the analyzing the digital waveform in the processor to set a desired gain level of the receiver to an optimal level, whereby incremental AGC control of the receiver stage may be avoided.

These and other embodiments and advantages will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following example figures.

DETAILED DESCRIPTION OF EXAMPLE EMBODIMENTS

Figure 1:
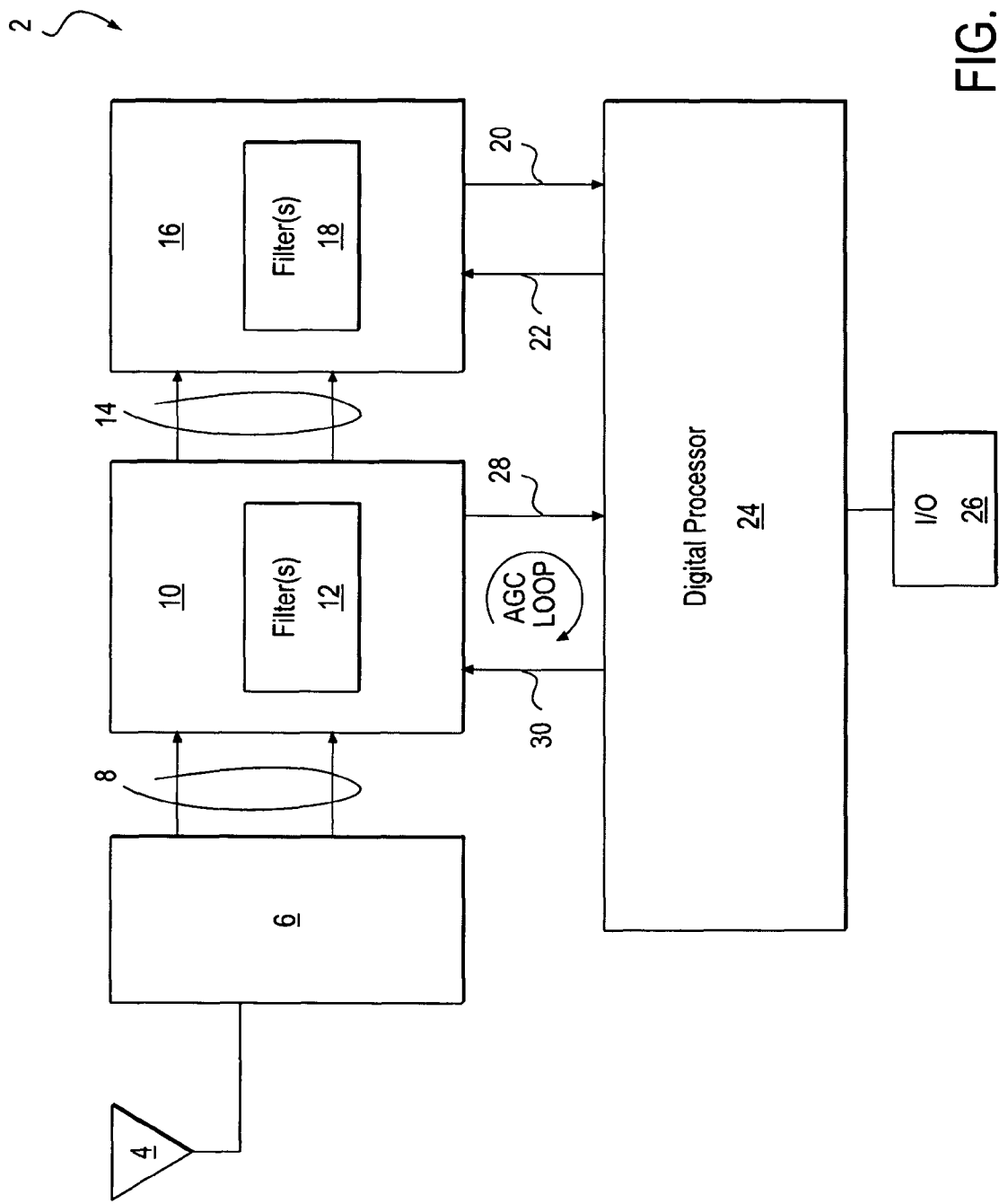
FIG. 1 is a block diagram of an example receiver with automatic gain control.

FIG. 1 is a block diagram illustrating a digital receiver system 2, set forth by way of example and not limitation. In this example, the digital receiver system 2 has an antenna 4 coupled to an antenna matching stage 6. Antenna matching stage 6 is coupled via a modulated signal input 8 to an AGC receiver 10. Antenna matching stage 6 typically comprises a network which matches the impedance of antenna 4 to the AGC receiver 10, as will be appreciated by those of skill in the art.

AGC receiver 10 includes circuitry to receive, demodulate and amplify the signal received at modulated signal input 8. In certain example embodiments, the AGC receiver 10 includes one or more configurable filter(s) 12. AGC receiver 10 is coupled via signal output 14 to a digitization stage 16 which receives the demodulated signal and converts it to a digital waveform. In certain example embodiments, digitization stage 16 includes one or more configurable filter(s) 18.

Digitization stage 16 is coupled via digital signal output 20 to an input of digital processor 24. Digital processor 24 has an output 22 coupled to a control input of the digitization stage 16.

Digital processor 24 receives and post-processes the digital signal received via digital signal output 20. Digital processor is typically a microprocessor but may, in certain embodiments, be implemented otherwise. By way of non-limiting example, digital processor may be a state machine implemented by any number of well known technologies such as programmable gate arrays or a customized integrated circuit.

Digital processor 24 is coupled to I/O stage 26 which is used for various digital inputs and outputs including, without limitation, the output of the digital signal and external programmability of receiver with automatic gain control 2. In certain non-limiting example embodiments I/O stage 26 includes a serial peripheral interface (SPI).

In this example embodiment, digital processor 28 has a waveform input 28 coupled to the AGC which, in combination with the current gain setting, can be used to calculate a new gain setting. The gain setting, in this example, is provided as a digital word via AGC control output 30 which couples digital processor 28 to AGC receiver 10. AGC receiver 10 applies the gain setting received from AGC control output 30 to the modulated signal obtained from modulated signal input 8.

Figure 2:
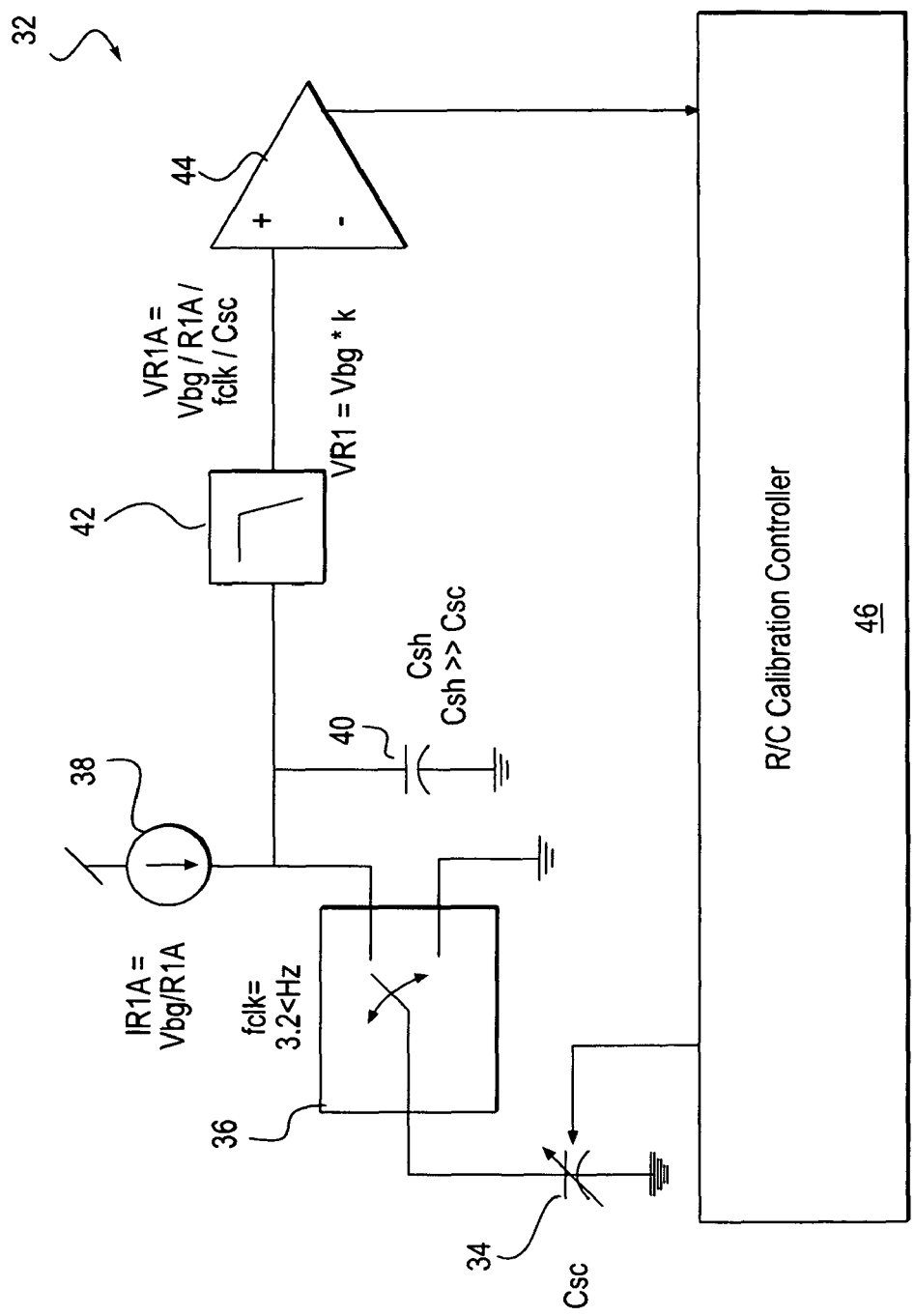
FIG. 2 is a block diagram of an example R/C calibration controller for filters, such as filters used in the example receiver of FIG. 1.

As will be appreciated by those of skill in the art, proper operation of digital receiver system 2 depends upon the correct calibration of various filters such as AGC receiver filter(s) 12 and digitization stage filter(s) 18. The manner in which the calibrations are performed may be chosen from a wide variety of methods known to those of skill in the art. FIG. 2 is a schematic diagram describing an example R/C time constant calibration circuit which has been found to be useful in certain example embodiments.

Example calibration circuit 32 as shown in FIG. 2 includes a switched capacitor (Csc) 34, a clock 36, a current source 38, a capacitor (Csh) 40, a low pass filter 42, a comparator 44 and an R/C calibration controller 46. It will be appreciated that the calibration circuit 32 operates as what is essentially a proxy oscillator; however the nature of this circuit is that it does not require a phase locked loop that certain other proxy oscillators use. As will be further appreciated by those skilled in the art, the voltage at capacitor 34 is known, because the current going into that node on the positive side of the capacitor is known, as is the clock frequency, and the value of the capacitor. As the switched capacitor 34 is charging and discharging, some residue associated with the clock is generated and capacitor 40 performs filtering on the clock residue. In addition, the filter 42 being calibrated is used, but at a frequency that is well below its cut-off frequency, such that the output of the filter is essentially a DC voltage.

A SAR algorithm embodied in the R/C calibration controller manipulates the switched capacitor 34 until the two D.C. voltages at the input of the comparator 44 converge. Once the D.C. values of the comparator 44 have converged, the R/C time constant is calibrated to within the ability to "tune" the switched capacitor 34. The SAR controller manipulates the capacitor code until:

$$VR1A = CR1$$

$$R1A * Csc = 1/fclk/k$$

RC time constant is stable

An advantage of using this example approach is that it performs the desired calibration with minimal hardware, and thus a low-cost solution is provided. Further reduction of cost can be achieved by "borrowing" components from other portions of the receiver with automatic gain control 2 which are not in use at calibration time. For example, a sample and hold capacitor associated with an analog-to-digital converter (ADC) may be used for capacitor 40. Such "borrowing" can be achieved by isolating said components from the any other circuits using switches, as is well known to those skilled in the art.

Figure 3:
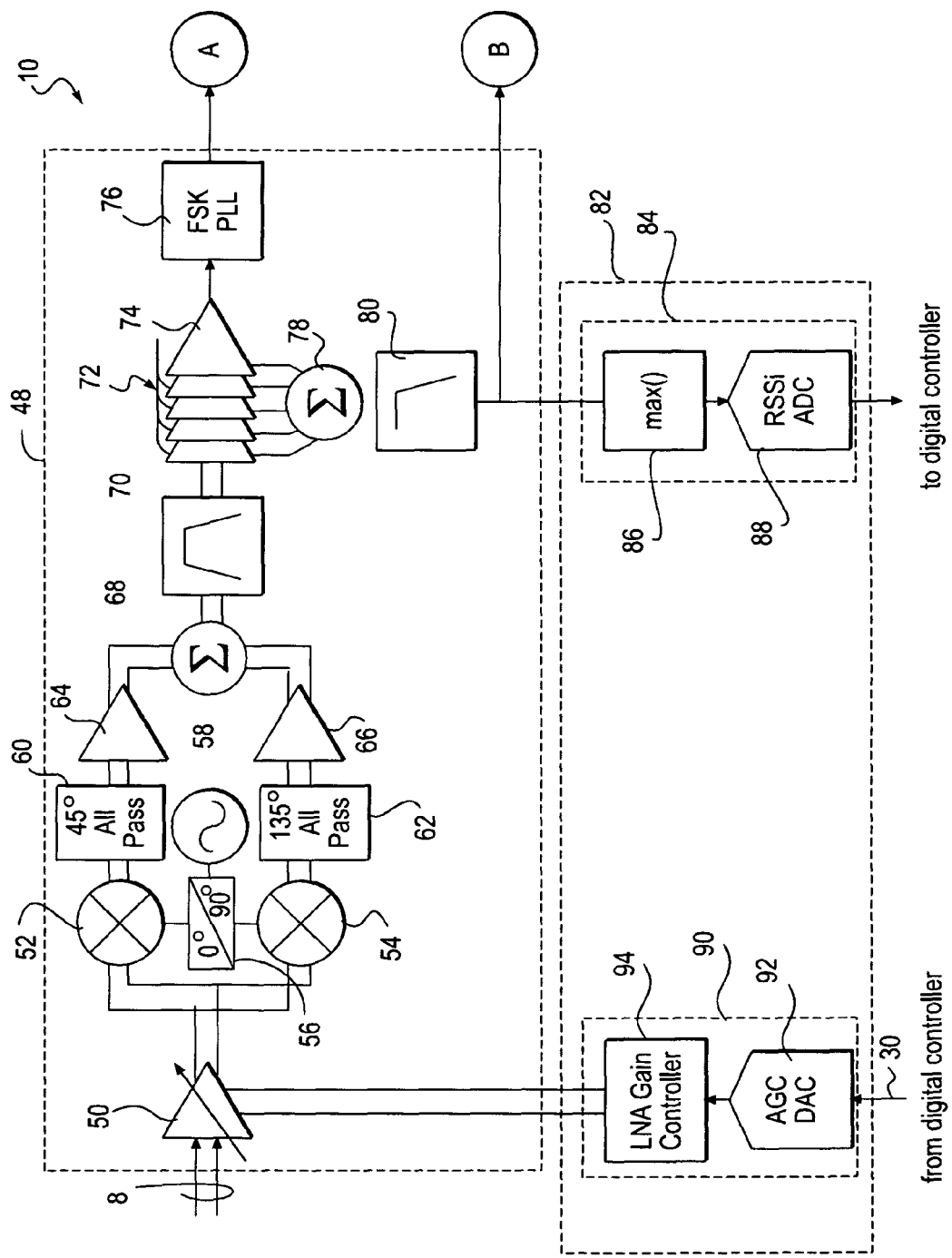
FIG. 3 is a is a block diagram of an example receiver stage and an example AGC stage of the receiver of FIG. 1.

FIG. 3 is a block diagram depicting example AGC receiver 10 of FIG. 1 in greater detail. AGC receiver 10 includes a receiver stage 48 having a variable gain preamplifier 50 which is coupled to modulated signal input 8. Variable gain preamplifier 50 amplifies the modulated signal and provides an amplified output signal to mixers 52 and 54 forming part of a superheterodyne intermediate frequency circuit. Mixers 52 and 54 are coupled to 0° and 90° phase shift outputs respectively of phase shifter 56 that is coupled to a local oscillator 58. This arrangement is used to "mix-down" the modulated signal to a lower or "intermediate" frequency so that the signal can be processed more easily, as will be appreciated by those skilled in the art.

Outputs of mixers 52 and 54 are coupled to a 45° all pass filter 60 and a 135° all pass filter 62, respectively. The 45° all pass filter 60 and the 135° all pass filter 62 perform an image reject on the output of mixers 52 and 54 respectively which effectively removes the image frequency. The outputs of 45° all pass filter 60 and 135° all pass filter 62 are coupled to the inputs of amplifiers 64 and 66 respectively. Amplifiers 64 and 66 are coupled to summer 68 which combines the phase shifted and amplified signals.

Summer 68 is coupled to a band pass filter 70 which receives the intermediate frequency modulated signal and performs a band selection function by applying a filter to select a band of interest. The output of band pass filter 70 is coupled to a rectification circuit 72 which includes of a number of rectifiers 74. A frequency modulation output of rectification circuit 72 is coupled to frequency shift keyed (FSK) phase locked loop (PLL) 76 which demodulates the frequency shift keyed signal if present. The demodulated output of FSK PLL 76 is provided as signal output of receiver stage 48 at a node A.

The outputs of rectifiers 74 are coupled to a summer 78 which adds the outputs of the several rectifiers. Persons of skill in the art will recognize the rectification circuit 72 and summer 78 as comprising an RSSI (Received Signal Strength Indicator) circuit. An output of summer 78 is coupled to a low pass filter 80 which filters noise associated with the rectified signal. The filtered signal, which includes an amplitude shift keyed signal, if present, is provided as signal output of receiver stage 48 at a node B. The filtered signal at node B is also an AGC output of receiver stage 48. The AGC output of receiver stage 48 provides signal strength information regardless of the type of modulation being used (e.g., AM, FM, etc.).

In the present example, the AGC output of receiver stage 48 is coupled to an input of matched AGC stage 82 which includes a feedback circuit 84. Feedback circuit 84 includes a peak detector 86, an input of which is coupled to the AGC output of receiver stage 48. Feedback circuit 84 further includes RSSI ADC 88, an input of which is coupled to an output of peak detector 86 which isolates the peaks of the received signal amplitude. RSSI ADC 88 converts the analog waveform to a digital waveform which describes the peaks of the signal amplitude. As will be appreciated by persons of skill in the art, the digital waveform is a gain feedback signal that can be used as part of the AGC loop.

RSSI ADC 88 is coupled via waveform input 28 to digital processor 24. Digital processor 24 analyzes the digital waveform, deriving a measured signal level. Digital processor 24 compares the difference between the desired and the measured signal levels. When a gain control change is required in accordance with the processes of digital processor 24, the new gain control setting is provided as a gain control signal via an AGC control output 30 of digital processor 24.

An input of matched AGC stage 82 is coupled to AGC control output 30. Matched AGC stage 82 further includes a control circuit 90, which is coupled to AGC control output 30. Control circuit 90 includes an AGC DAC 92 an input of which is coupled to AGC control output 30. The digital gain control signal, which in certain example embodiments is encoded as, a digital input word, is converted from digital to analog via AGC DAC 92. Control circuit 90 further includes an LNA gain controller 94, an input of which is coupled to an output of AGC DAC 92. Outputs of LNA gain controller 94 are coupled to variable gain preamplifier 50, which applies the gain setting to the incoming modulated signal.

According to certain example embodiments, the transfer characteristics of control circuit 90 are matched to those of feedback circuit 84. Thus, the units of the digital waveform input provided by matched AGC stage 82 are the same as the units used to express the gain control signal provided by the digital processor 24 to the matched AGC stage 82.

In certain non-limiting example embodiments, the respective transfer characteristics of control circuit 90 and feedback circuit 84 are linear and have substantially the same composite slope such that the effect of any gain control change results in a predictable change in the amplitude of the demodulated signal. Since the composite slopes are linear and matched, only a fast, efficient and straightforward difference calculation is needed to compute the gain control settings. Digital controller 24 attempts to set the gain directly to an optimal level based upon a digital waveform analysis derived from the gain feedback signal from feedback circuit 84. Unnecessary automatic gain control iterations or "hunting" associated with incremental AGC control of receiver stage 48 are thereby avoided.

Figure 4A:
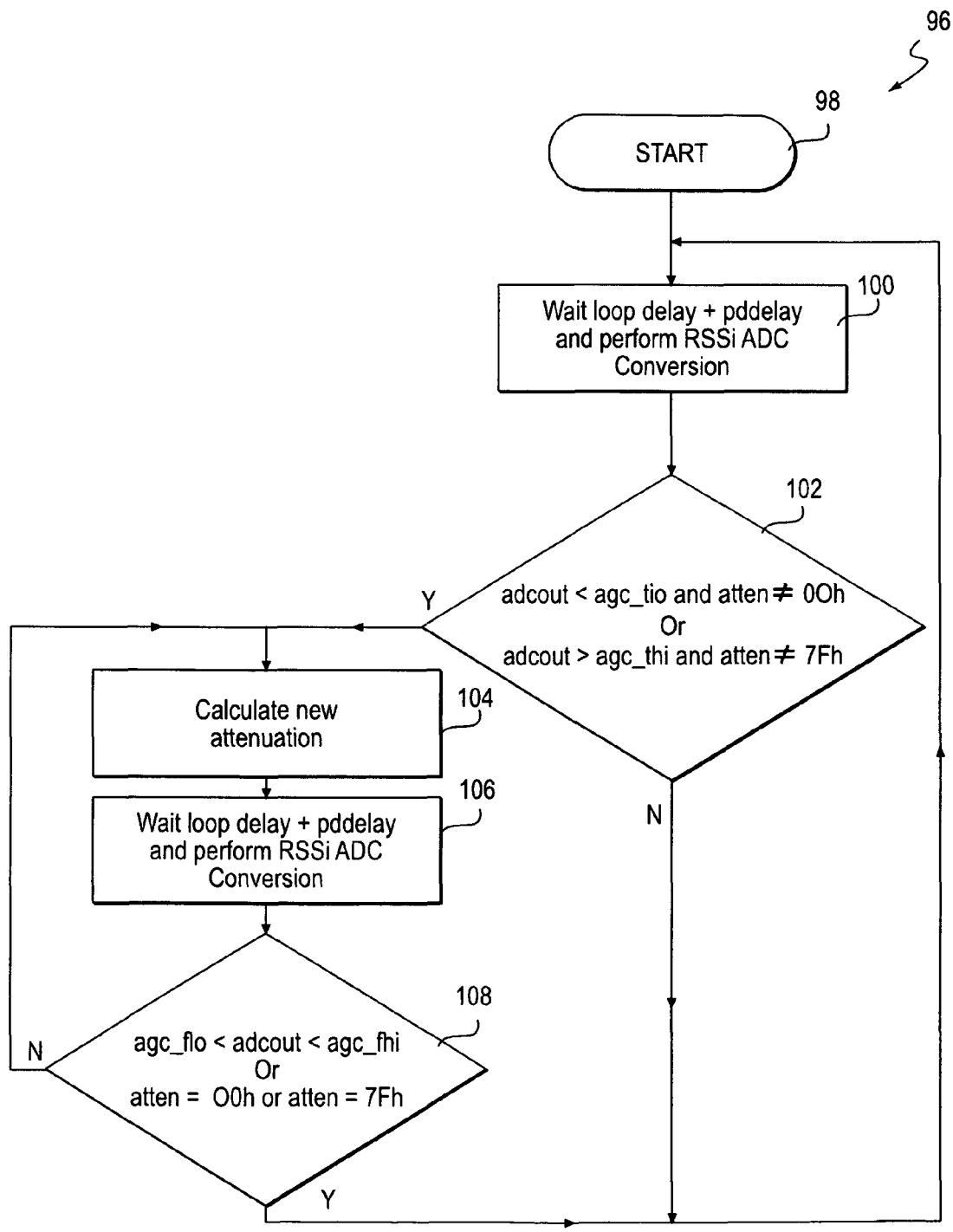
FIG. 4A is flow diagram of an example computer implemented method executing on the digital processor of FIG. 1.

FIG. 4A is a flow diagram illustrating an automatic gain control process 96, set forth by way of example and not limitation, which may implemented, for example, in digital processor 24 of FIG. 1. The example process 96 begins at an operation 98 and continues in an operation 100 wherein a wait loop delay is applied which gives the incoming digital waveform signal enough time to settle. Once the wait loop is completed the digital waveform information becomes available.

Next, in a decision operation 102, a determination is made as to whether the system should calculate a new attenuation setting. This determination is based on whether the present signal level is outside the desired hold range but also has a measurable, non-zero gain level within the limits of the dynamic range of the ADC. If it is determined the present gain level is outside the desired gain control hold range, and also has a measurable, non-zero gain level within the limits of the dynamic range of the ADC, then the operation continues in an operation 104; otherwise the operation continues with operation 100.

Operation 104 calculates and applies a new attenuation level. This calculation attempts to provide the optimal attenuation level such that additional calculations will not be necessary to bring the attenuation level within the AGC attack range. This is possible because of the matched transfer characteristics described herein.

The process 96 then continues in an operation 106 which performs a wait loop delay similar to that performed in operation 100. The operation then continues with a decision operation 108 which determines whether the previous attenuation calculation was sufficient to bring the attenuation within the AGC attack range, or additional attenuation calculations are futile because the current attenuation is already at the maximum or minimum attenuation. If it is determined in decision operation 108 that an additional attenuation calculation is either unnecessary or futile, the operation continues with operation 100. If on the other hand it is determined in operation 106 that an additional attenuation calculation is necessary and non-futile, the operation continues with operation 104.

Figure 4B:
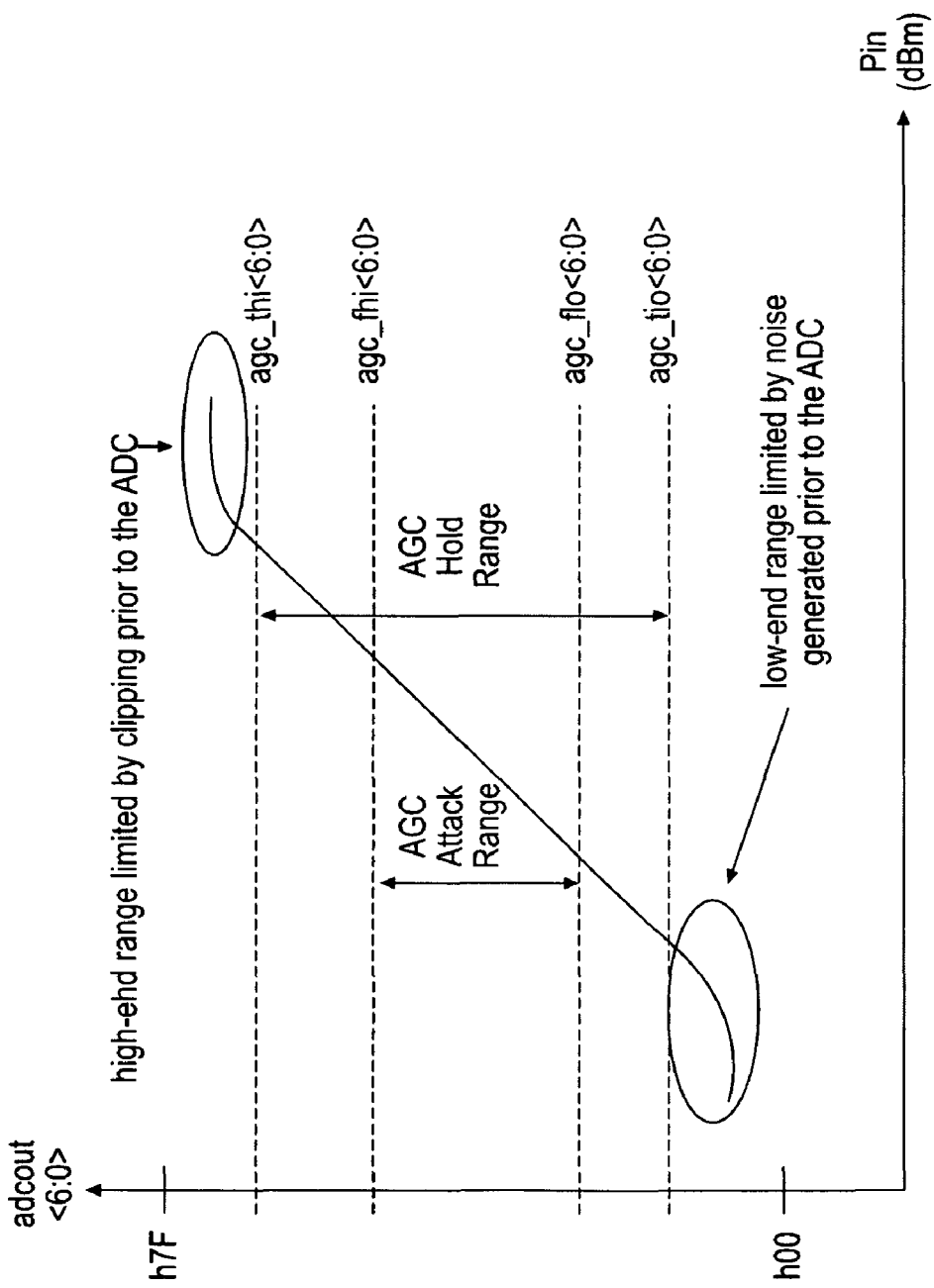
FIG. 4B is a diagram illustrating an example AGC attack range and an example AGC hold range.

With continuing reference to the example process of FIG. 4A, FIG. 4B illustrates an example AGC attack range and an example AGC hold range in the form of a graph depicting a dual-range approach used in certain exemplary embodiments. The mixed mode loop works to keep an RSSI ADC output between two programmable threshold values, namely agc_thi and agc_tlo. In this and similar non-limiting examples, the threshold values are represented by a 7 bit word "<6:0>." This range is called the AGC Hold Range. The example process illustrated by FIG. 4A first attacks to a more restrictive range defined, for example, by threshold values agc_fhi and a gc_flo. This range is called the AGC attack range. The two ranges allow gain control events to be minimized, which advantageously reduces potential data loss associated with gain changes. This is especially important in applications where the amplitude of the signal contains useful information. In certain exemplary embodiments, an RSSI ADC range is designed so that the converter does not limit the dynamic range of the receiver on either the low-end or the high-end.

It should be noted that the AGC attack range is more restrictive than the AGC hold range. This dual range approach provides hysteresis which minimizes signal disruption caused by unnecessary gain changes. In this way, a configurable mixed-signal fast-attack AGC System for a multi-bank, multi-mode receiver may be provided.

Figure 5:
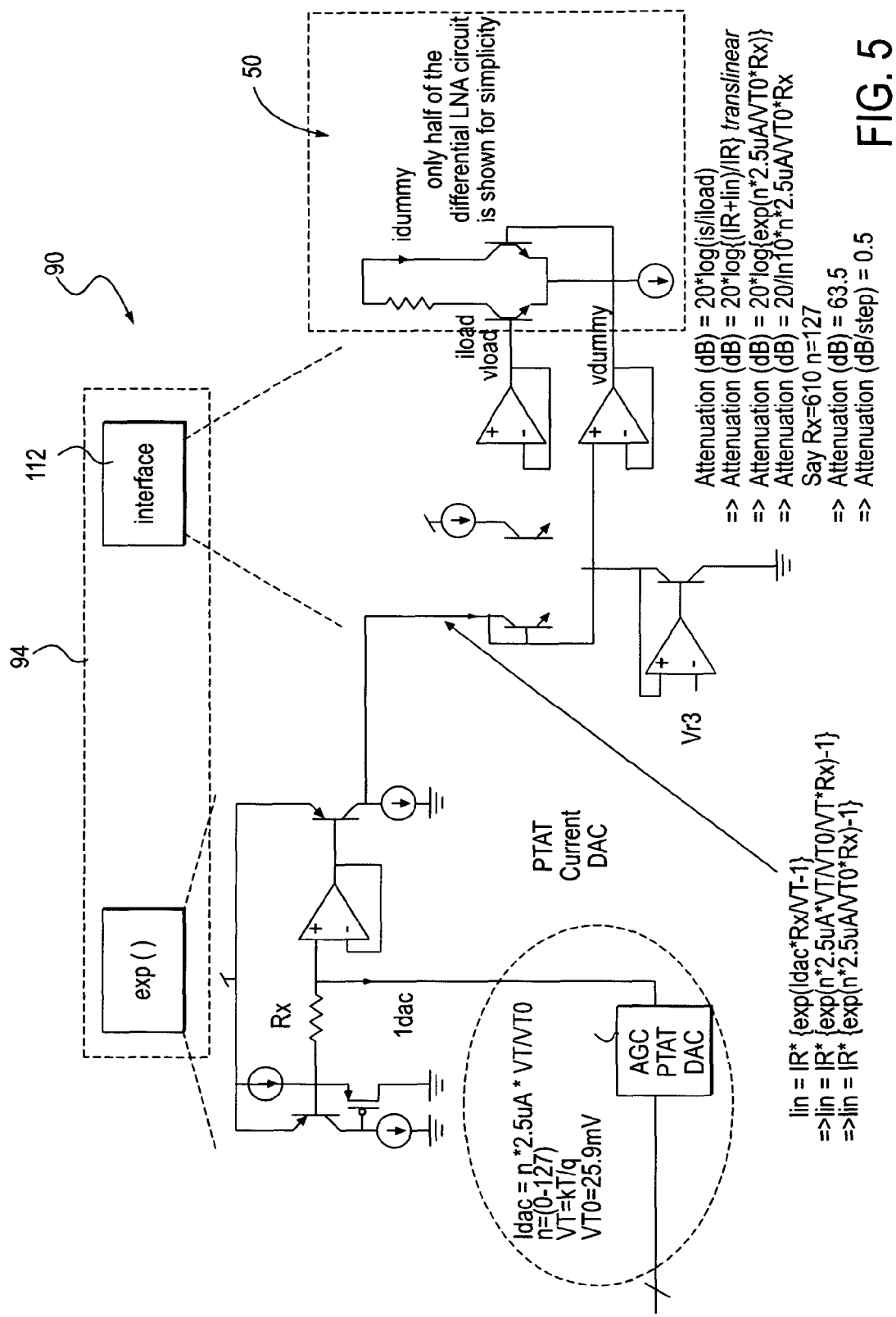
FIG. 5 is a schematic diagram illustrating example LNA design equations for the LNA gain controller of FIG. 3.

FIG. 5 is a schematic diagram which models certain exemplary embodiments of control circuit 90 as well as variable gain preamplifier 50. As described previously, control circuit 90 is comprised of AGC DAC 92 and LNA gain controller 94. An output of AGC DAC 92 is coupled to an input of LNA gain controller 94 as shown. LNA gain controller 94 is comprised of temperature compensated exponentiator 110, which is coupled to an output of AGC DAC 92. LNA gain controller 94 is further comprised of interface circuit 112, an input of which is coupled to an output of temperature compensated exponentiator 110. Inputs of variable gain preamplifier 50 are coupled to outputs of interface circuit 112 which provide the gain setting in this example.

As shown in FIG. 5, temperature compensated exponentiator 110 is depicted in greater detail as indicated by broken lines bracketing a schematic diagram. Also, interface circuit 112 is similarly depicted in greater detail as indicated by broken lines bracketing a schematic diagram. It should be noted that in the example shown in FIG. 5 that only a portion of variable gain preamplifier 50 is shown for the sake of simplicity. Also shown in FIG. 5 are example design equations which provide transfer characteristics that are matched to the transfer characteristics of the feedback circuit of FIG. 3 to provide the advantages noted above, as will be appreciated by those of skill in the art.

Although various embodiments have been described using specific terms and devices, such description is for illustrative purposes only. The words used are words of description rather than of limitation. It is to be understood that changes and variations may be made by those of ordinary skill in the art without departing from the spirit or the scope of the present invention, which is set forth in the following claims. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A receiver with automatic gain control comprising:
   a) a receiver stage having a modulated signal input, a signal output, an Automatic Gain Control (AGC) input and an AGC output, whereby a signal at said signal output experiences a gain from said receiver stage;
   b) a matched AGC stage including:
      i) control circuit including an AGC Digital-to-Analog Converter (DAC) having a digital input and an analog output and a Low Noise Amplifier (LNA) gain controller having an input coupled to said analog output of said AGC DAC and an output coupled to said AGC input of said receiver stage; and
      ii) a feedback circuit comprising a peak detector having an input coupled to said AGC output and an output, and a Received Signal Strength Indication (RSSI) Analog-to-Digital Converter (ADC) having an input coupled to said output of said peak detector and a digital output defining a waveform, whereby said control circuit and said feedback circuit have matched transfer characteristics; and
   c) a digital processor having a waveform input coupled to said digital output of said RSSI ADC and an control output coupled to said digital input of said AGC DAC, said digital processor being operative to develop a gain control signal at said control output to set a desired gain level of said receiver stage to an optimal level based upon a waveform analysis derived from said gain feedback signal;
   wherein said receiver stage includes a variable gain preamplifier circuit having, as inputs said modulated signal input and said AGC input, an intermediate frequency circuit having an input coupled to an output of said preamplifier circuit, it detector circuit having an input coupled to an output of said intermediate frequency circuit, and a rectification circuit having an input coupled to an output of said detector circuit.

2. A receiver with automatic gain control as recited in claim 1 wherein said modulated signal input is at least one of a frequency modulated signal, an amplitude modulated signal and a phase modulated signal.

3. A receiver with automatic gain control as recited in claim 2 further comprising antenna-matching stage having an output coupled to said modulated signal input of said receiver stage.

4. A receiver with automatic gain control as recited in claim 3 further comprising an antenna coupled to said antenna-matching stage.

5. A receiver with automatic gain control as recited in claim 4 further comprising a digitization stage having a signal input coupled to said signal output of said receiver stage and an output coupled to said digital processor.

6. A receiver with automatic gain control as recited in claim 5 further comprising an Input/Output (I/O) stage coupled to said digital processor.

7. A receiver with automatic gain control as recited in claim 1 wherein said intermediate frequency circuit includes a superheterodyne circuit.

8. A receiver with automatic gain control as recited in claim 1 wherein said detector circuit includes a band pass filter.

9. A receiver with automatic gain control as recited in claim 8 wherein said rectification circuit includes a plurality of rectifiers.

10. A receiver with automatic gain control as recited in claim 9 further comprising a summing circuit having, as inputs, outputs of said plurality of rectifiers.

11. A receiver with automatic gain control as recited in claim 10 further comprising is low pass filter having an input coupled to an output of said summing circuit and having, as an output, said AGC output.

12. A receiver with automatic gain control as recited in claim 11 wherein said AGC output comprises said signal output of said receiver.

13. A receiver with automatic gain control as recited in claim 11 further comprising a Phase Locked Loop (PLL) circuit having an input coupled to an output of said rectification circuit and, having as an output, said signal output of said receiver.

14. A receiver with automatic, gain control as recited in claim 13 wherein said PLL is a Frequency Shift Keyed (FSK) PLL.

* * * * *